(12) United States Patent
Fukuta et al.

(10) Patent No.: US 7,474,008 B2
(45) Date of Patent: Jan. 6, 2009

(54) SEMICONDUCTOR DEVICE WITH REDUCED ELECTROMIGRATION

(75) Inventors: Kazuhiko Fukuta, Fukuyama (JP); Kenji Toyosawa, Fukuyama (JP); Takashi Kidoguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 231 days.

(21) Appl. No.: 11/133,379

(22) Filed: May 20, 2005

(65) Prior Publication Data
US 2005/0263909 A1    Dec. 1, 2005

(30) Foreign Application Priority Data
May 21, 2004    (JP) .............................. 2004-152372

(51) Int. Cl.
  *H01L 23/28*    (2006.01)
(52) U.S. Cl. ...................... 257/787; 257/788; 257/795; 257/E23.116; 257/E23.128
(58) Field of Classification Search ......... 257/787–789, 257/795, E23.116, E23.128
See application file for complete search history.

(56) References Cited

U.S. PATENT DOCUMENTS

| | | | |
|---|---|---|---|
| 4,189,577 A | 2/1980 | Sawa et al. | |
| 4,205,156 A | 5/1980 | Sawa et al. | |
| 5,623,006 A | * 4/1997 | Papathomas | ................ 524/100 |
| 6,174,589 B1 | 1/2001 | Kawakita et al. | |
| 2003/0052420 A1 | 3/2003 | Suzuki et al. | |
| 2004/0061240 A1 | 4/2004 | Seko | |

FOREIGN PATENT DOCUMENTS

| | | |
|---|---|---|
| EP | 0237255 | 7/1987 |
| JP | 61-012772 | 1/1986 |
| JP | 01-294765 | 11/1989 |
| JP | 9-199632 | 7/1997 |
| JP | 11-92740 | 4/1999 |
| JP | 11-144527 (A) | 5/1999 |
| JP | 2000-103838 | 4/2000 |
| JP | 2001-316566 | 11/2001 |
| JP | 2002-222897 | 8/2002 |
| JP | 2002-302534 | 10/2002 |

OTHER PUBLICATIONS

"Surface Raman Spectroscopic Studies of Benzotriazole on Copper and Iron Electrodes", Cao Peigen, Yao JianLin, Gu Renao, Tian Zhongqun, Chinese Journal of Light Scattering, Apr. 1999, vol. 11 No. 1, pp. 1-5.

* cited by examiner

*Primary Examiner*—Hoai V Pham
(74) *Attorney, Agent, or Firm*—Harness, Dickey & Pierce, P.L.C.

(57) ABSTRACT

A high reliability semiconductor device is provided which can prevent electromigration due to the deposition of metal ions originating from wires. The device includes: a flexible wiring board 11 including a base film 1 and multiple wires 9; a semiconductor chip 5 mounted to the flexible wiring board 11; and a sealing resin 6 disposed between the flexible wiring board 11 and the semiconductor chip 5 so as to at least partially in contact with the wires 9. The sealing resin 6 contains a metal ion binder mixed thereto.

9 Claims, 5 Drawing Sheets

ENLARGED VIEW OF SECTION A

SEMICONDUCTOR DEVICE WITH REDUCED ELECTROMIGRATION

This Nonprovisional application claims priority under 35 U.S.C. § 119(a) on Patent Application No. 2004-152372 filed in Japan on May 21, 2004, the entire contents of which are hereby incorporated by reference.

FIELD OF THE INVENTION

The present invention relates in general to semiconductor devices and in particular to those with limited electromigration in wires.

BACKGROUND OF THE INVENTION

COFs and TCPs are well-known examples of semiconductor devices carrying electronic components mounted on a wiring board. A COF, or chip on film, contains semiconductor elements mounted/joined onto a flexible wiring board. A TCP, or tape carrier package, contains semiconductor elements continuously joined to a flexible wiring board. The COF and TCP are chiefly applied to semiconductor devices containing a LCD (liquid crystal driver) IC.

Recent demand for LCDs with increased numbers of outputs is rapidly pushing the flexible wiring board for LCD ICs to finer wiring pattern pitches. Currently, the COF is more suited to fine-pitched wiring pattern than the TCP. Thus the COF is the popular choice for packaging of LCD ICs.

Now, a conventional fabrication method of a COF will be described in reference to FIG. 9.

First, the fabrication method of a flexible wiring board 50 is shown. A metal layer with a barrier function is formed by sputtering on a polyimide base component 51. Then, copper foil is formed by metalizing (copper plating). A photoresist is applied onto the copper foil and then cured. Thereafter, the photoresist is exposed and developed to form a pattern which matches the desired wiring pattern. The copper foil, along with the metal layer with a barrier function, is etched in accordance with the photoresist pattern. Removing the photoresist completes the transfer of the desired pattern. The process provides a wiring pattern barrier layer 52 and a copper conductor layer 53. The entire surface of the conductor pattern is plated uniformly with tin 58 to a thickness of 0.4 to 0.6 μm, to complete the fabrication of wires 59. Further, to provide protection to the wires 59, those parts of the surface of the wires 59 which have no relevance in connecting to the semiconductor chip are covered with solder resist 57. This completes the fabrication of the flexible wiring board 50.

The completed flexible wiring board 50 is joined to a semiconductor chip having gold bumps (protruding electrodes) 54. The joints are formed of eutectic AuSn between the tin plating 58 and the gold bumps 54. The joining step is called inner lead bonding (ILB).

After the ILB, the gap between the semiconductor chip 55 and the flexible wiring board 50 is filled with an underfill (i.e., thermosetting) sealing resin 56 to provide protection to the semiconductor chip 55. The sealing resin 56 is then thermally cured.

Thereafter, a final test as to electrical characteristics is conducted to complete the fabrication of the COF.

Demand has been growing recently for semiconductor devices with even more outputs. Accordingly, voltage on the wires 59 is on the rise, while the pitch for the wiring pattern is falling. However, the conventional semiconductor device cannot accommodate such high-voltage, low-pitch wires 59 and suffers electromigration between the wires 59. When a DC voltage is applied across adjacent wires at high humidity, the metal from which the wires are made can ionize and dissolve in electrochemical reaction. The wire material thus may deposit and grow where no wiring was initially provided. This phenomenon is termed electromigration. With a high voltage across one of the wires 59, the potential difference from an adjacent one of the wires 59 increases, which makes the wires 59 more prone to electromigration. Another factor is the spacing of the wires 59. As the pitches narrow down, the electric field strength of a wire 59 on an adjacent wire 59 increases, which makes electromigration more likely.

Electromigration results in metal ions depositing also between wires 59. The deposition short-circuits the wires 59, possibly leading to an isolation breakdown. The semiconductor device thus loses reliability. Accordingly, the prevention of electromigration over a long term is key to ensuring the reliability of the semiconductor device.

Occurrence of electromigration may be limited by several methods. One of them is to provide moisture prevention means preventing moisture from reaching the spacings between wires so as to prevent high degrees of humidity. The moisture prevention means may be provided, for example, by imparting moisture resistance to routes through which moisture can seep to the wiring. The possible routes include the base component of the flexible wiring board, the solder resist, and the sealing resin. However, all these members need be organic polymer materials permeable to water. It is difficult to completely stop moisture from reaching the spacings. Another technique is to apply a moisture resistant film. Such a film however requires a lot of labor and cost with only insufficient results in the limitation of electromigration.

A second method is to reduce contamination with chloride and other halogen ions which hastens the wiring material dissolving into metal ions. Halogen ions are however found in the material itself. It is difficult to completely remove halogen ions and like ionic impurities.

A third method is to reduce the electric field strength across the wiring so as to slow down the rate of the wiring material dissolving into metal ions. Nevertheless, narrowing connection pitches between the semiconductor chip and the flexible wiring board on which the chip sits and increasing application voltage across the wiring are inevitable to achieve high density packaging and high functionality of the semiconductor device. This in turn inevitably increases electric field strength across the wiring pattern.

Thus, electromigration cannot be prevented from occurring in the COF semiconductor device without significant cost, with the falling wiring pitches and high voltage application across the wiring. This presents an obstacle in developing semiconductor devices with high functionality.

Meanwhile, Japanese published patent application 11-144527/1999 (Tokukaihei 11-144527; published on May 28, 1999) discloses a conductive paste attaching electronic components onto the substrate. To prevent electromigration of silver ions, the conductive paste is mixed with a silver ion binder which forms a complex with silver ions. However, the conductive paste is not applicable to semiconductor wiring and falls short of addressing electromigration in wires.

SUMMARY OF THE INVENTION

The present invention has an objective to provide a high reliable semiconductor device in which electromigration due to deposition of wiring metal ions is prevented.

The semiconductor device in accordance with the present invention, to address the problems, is characterized in that it includes: a wiring board including a base component and wires; a semiconductor element provided on the wiring board; and a metal ion binder either mixed with a material for a member in contact with the wires or added to a surface of the wires.

The material of the wires in metal ion form comes in contact with the metal ion binder contained in the member in contact with the wires or added to the surface of the wires. The ions are captured by the binder and prevented from depositing.

If the metal ions from a wire deposit, there occurs a metal growth from the wire (electromigration). The wire can end up being connected to an adjacent one. If this really happens, the interwire isolation breaks down. The connections between the semiconductor element and other devices fail, and operational failures occur.

The present invention prevents this deposition of the wiring metal, let alone the growth of the metal. The semiconductor device is no longer susceptible to such operational failures.

The semiconductor device in accordance with the present invention is characterized in that it further includes a sealing resin disposed between the wiring board and the semiconductor element so as to be at least partially in contact with the wires, wherein the sealing resin contains the metal ion binder.

The sealing resin here are of those kinds which are generally used to protect the wiring board, the semiconductor element, and their contacts and to reinforce the contacts.

The inclusion of the metal ion binder in the sealing resin allows the metal ion binder in the sealing resin to act on the wires. Concretely, the metal ions from the wires come in contact with, and captured by, the metal ion binder in the sealing resin. The metal ions remain inside the sealing resin and do not deposit.

Therefore, the deposition of the wire-originating metal ions is prevented by simply adding the metal ion binder to the sealing resin. No additional manufacturing step or member is required over the conventional semiconductor device. The growth of the wire-originating metal is prevented. The semiconductor device is prevented from developing operational failures.

The semiconductor device in accordance with the present invention is characterized in that the sealing resin has a viscosity from 50 mPa·s to 1250 mPa·s inclusive upon filling spacing between the wiring board and the semiconductor element.

The sealing resin fills the spacing between the wiring board and the semiconductor element, leaving no voids, while it is retaining the fluidity before being cured. Then the resin is cured. Therefore, the resin preferably has such a fluidity that when the metal ion binder is added, the resin can still fill the spacing with no voids being left.

If the resin has a viscosity in the foregoing range, before the sealing resin is cured, that is, before the resin fills the spacing between the wiring board and the semiconductor element, the resin is readily applicable, and has such a fluidity that the resin can completely fill the spacing between the wiring board and the semiconductor element.

If the viscosity is less than 50 mPa·s, the fluidity becomes too high. The sealing resin may undesirably flow out or not stick to the semiconductor element, especially, to the side face of the semiconductor element. In contrast, if the viscosity is more than 1250 mPa·s, the fluidity becomes too low. The sealing resin is hard to flow from the dispenser and may leave voids in the sealing resin.

The semiconductor device in accordance with the present invention is characterized in that the metal ion binder accounts for from 0.5 wt. % to 10.0 wt. % inclusive of the sealing resin.

The resin has such a fluidity that the resin is readily applicable before being cured and completely fills the spacing between the wiring board and the semiconductor element. Also, the metal ion binder shows a sufficient electromigration limiting effect.

If the metal ion binder accounts for less than 0.5 wt. %, the electromigration limit effect is insufficient. If the binder accounts for more than 10 wt. %, the viscosity becomes too high, making the resin hard to apply and possibly leaving voids in the sealing resin after filling.

The semiconductor device in accordance with the present invention is characterized in that the wires are provided on a surface of the base component; and the base component contains the metal ion binder.

The base component contains the metal ion binder, allowing the metal ion binder in the base component to act on the wires. Concretely, the metal ions from the wires come in contact with, and captured by, the metal ion binder in the base component. The metal ions remain inside the base component and do not deposit.

Therefore, the deposition of the wire-originating metal ions is prevented by simply adding the metal ion binder to the base component. No additional manufacturing step or member is required over the conventional semiconductor device. The growth of the wire-originating metal is prevented. The semiconductor device is prevented from developing operational failures.

The semiconductor device in accordance with the present invention is characterized in that it further includes a solder resist disposed to cover the surface of the wires, wherein the solder resist contains the metal ion binder.

The solder resist here are of those kinds which are generally used to prevent the wires from developing short-circuiting and line breaks. The resist covers those parts of the wires which are electrically isolated, thus preventing dirt and dust from sticking thereto and mechanical stress from building up.

The inclusion of the metal ion binder in the solder resist allows the metal ion binder in the solder resist to act on the wires. Concretely, the metal ions from the wires come in contact with, and captured by, the metal ion binder in the solder resist. The metal ions remain inside the solder resist and do not deposit. The growth of the wire-originating metal is also prevented. The semiconductor device is prevented from developing operational failures.

The growth of the wire-originating metal is also prevented by simply adding the metal ion binder to the material for the solder resist. No additional manufacturing step or member is required over the conventional semiconductor device. The semiconductor device is prevented from developing operational failures.

The semiconductor device in accordance with the present invention is characterized in that the metal ion binder contains at least one compound selected from the group consisting of benzotriazoles, triazines, and isocyanuric acid adducts of these compounds.

These compounds form a complex with copper and other metal ions from the wires, thereby capturing the ions and preventing deposition.

The semiconductor device in accordance with the present invention is characterized in that the wring board is a flexible film.

Demands are high for reduced wiring pitches and increased voltage in such semiconductor devices. The present invention contributes to increase the performance of the semiconductor device by preventing wire-originating metal ion deposition.

The semiconductor device in accordance with the present invention is characterized in that the semiconductor element is mounted to the wiring board by a tape carrier packaging.

The tape carrier packaging here refers to arranging semiconductor element mounting areas along the length of a tape-like flexible board. The method enables successive, mechanical mounting of semiconductor elements to the mounting areas. Compatible with reel-to-reel handling, the products have advantages in automating their manufacture.

Demands are high recently for high density packaging, high functionality, and increased outputs in such semiconductor devices. Especially strong demands are found for reduced wiring pitches and increased voltage. The present invention contributes to increase the performance of the semiconductor device by preventing wire-originating metal ion deposition.

The semiconductor device in accordance with the present invention is characterized in that a liquid crystal display element is mounted.

Demands are high for reduced wiring pitches and increased voltage in such semiconductor devices. The present invention contributes to increase the performance of the semiconductor device by preventing wire-originating metal ion deposition.

Additional objects, advantages and novel features of the invention will be set forth in part in the description which follows, and in part will become apparent to those skilled in the art upon examination of the following or may be learned by practice of the invention.

BRIEF DESCRIPTION OF THE DRAWINGS

FIG. 5(a) shows the wiring board in its entirety. FIG. 5(b) shows section A in an enlarged view.

DESCRIPTION OF THE EMBODIMENTS

The present invention addresses electromigration problems in COF (chip on film) and other types of semiconductor devices. Electromigration occurs when the wiring material ionizes and deposits at high humidity. A metal ion binder forming a complex with metal ions is added into a basic component which comes in contact with the wiring. Alternatively, the binder is applied uniformly across the wire surface. The use of the binder restricts metal ion deposition in electromigration. The invention thus provides highly reliable COFs which allow for further reductions in wire pitches and increases in voltage.

The following will describe an embodiment of the present invention in reference to FIG. 1 through FIG. 8.

Figure 1:
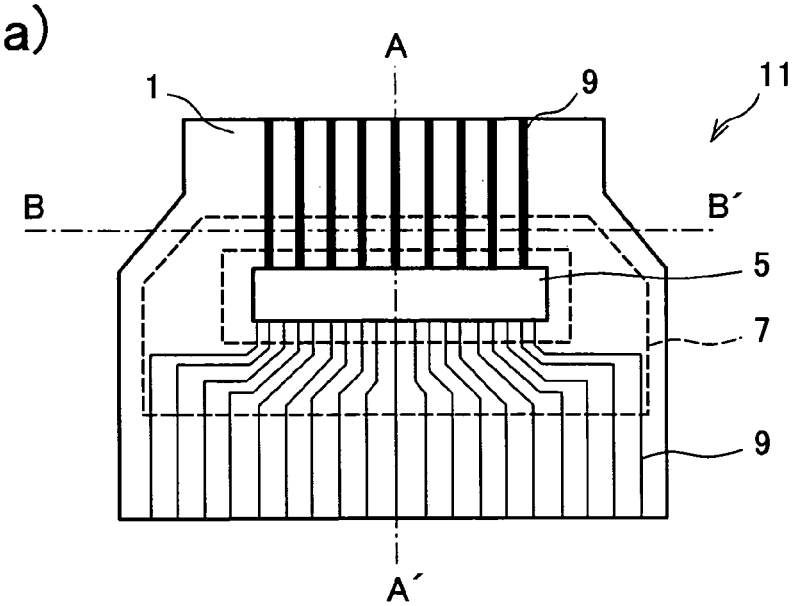
FIG. 1(a) is a plan view illustrating a semiconductor device in accordance with an embodiment of the present invention.
FIG. 1(b) is a drawing illustrating these semiconductor devices mounted on a tape carrier in a manufacture step.
Figure 1:
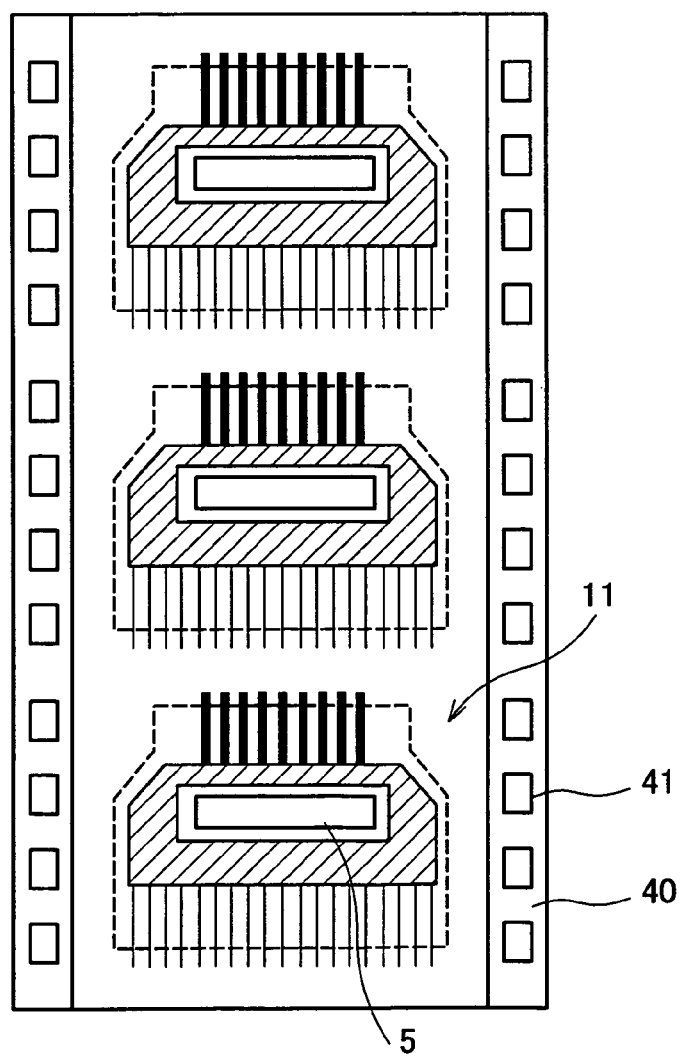
Figure 2:
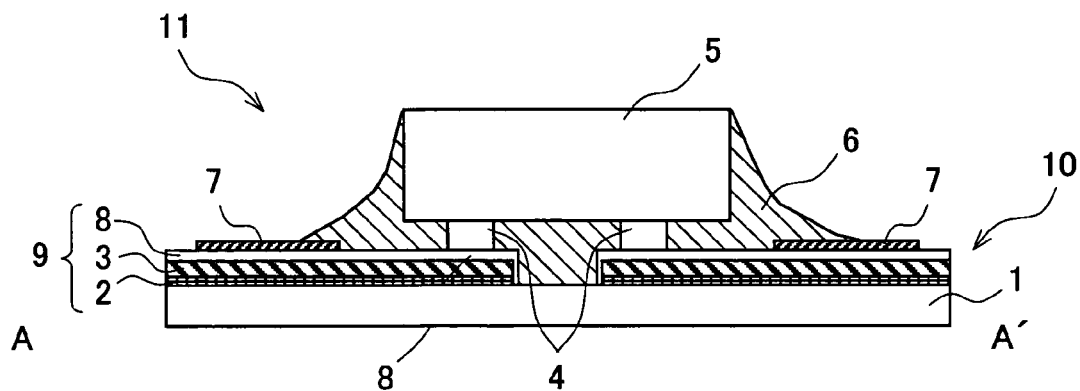
FIG. 2 is a cross-sectional view along line A-A' illustrating the FIG. 1(a) semiconductor device.
Figure 3:
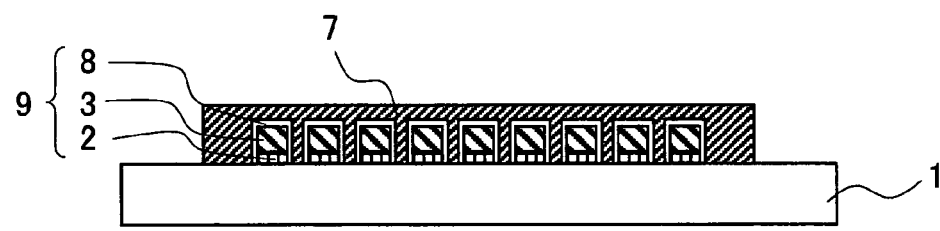
FIG. 3 is a cross-sectional view along line B-B' illustrating the FIG. 1(a) semiconductor device.

FIG. 1(a) is a plan view of a semiconductor device in accordance with the present invention. FIG. 2 is a cross-sectional view along line A-A' in FIG. 1(a). FIG. 3 is a cross-sectional view along line B-B' in FIG. 1(a).

A semiconductor device 11 in accordance with the present invention contains, as shown in FIG. 2, a flexible wiring board 10, a semiconductor chip 5, and a sealing resin 6.

The flexible wiring board 10 includes a base film (base component) 1, multiple wires 9, and a solder resist 7. The latter two members are formed in this order on the film 1. The semiconductor chip 5 is mounted on the board 10 so that it effectively connects to external devices through the wires 9 provided on the board 10. The base film 1 is made of polyimide and acts as the base component of the flexible wiring board 10. Each wire 9 connects to the semiconductor chip 5 at an end and to an external device at the other end, hence providing electrical connections between the semiconductor chip 5 and the external devices. Gold bumps 4 on the semiconductor chip 5 are joined to the wires 9 as the bumps and wires form a gold-tin eutectic alloy in thermocompression. The solder resist 7 provides a cover protecting the wires 9 from short-circuiting, line breaks, etc.

Here, the wires 9 extend linearly on the surface of the base film 1 from under the semiconductor chip 5 to either end of the base film 1. The wires 9 are made of a barrier layer 2, a conduction layer 3, and a tin plating 8. The barrier layer 2 is a chromium-nickel alloy and forms that part of the wires 9 which is provided on the base film 1. The barrier layer 2 protects the conductor layer 3 and enhances adhesion of the wires 9 to the base film 1. The conduction layer 3 is made of copper and provides a good electrical passage in the wires 9. The tin plating 8 is disposed across the entire surface of the conduction layer 3. Each wire 9 is separated from an adjacent wire 9 by a distance as small as 30 μm.

The solder resist 7 is provided on the base film 1 to cover the wires 9. The resist 7 surrounds the semiconductor chip 5 at a small distance from the chip 5. Accordingly, the solder resist 7 provides protection to all parts of the wires 9 which are not engaged in any electrical connection, thereby preventing short circuits, line breaks, and other like defects. When the distance separating adjacent wires 9 (wire pitch) is reduced to about, for example, 30 μm or even less, the wires 9 are prone to short-circuiting due to external dirt and dust and line breaks under external mechanical stress. The wires 9 are protected from these defects by the provision of the solder resist 7. Also, the solder resist 7 improves electrical isolation of the wires 9 and the flexibility of the flexible wiring board 10.

The semiconductor chip 5 has the protruding gold bumps 4 on a face thereof where the chip 5 is joined to the flexible wiring board 10 (joint face). The chip and board are joined through the bumps 4 and the wires 9 as the bumps and wires form a gold-tin eutectic alloy in thermocompression. The semiconductor chip 5 is thus mounted to the board 10 with the ends of the wires 9 being connected thereto.

The sealing resin 6 is disposed between the side and joint faces of the semiconductor chip 5 and a face of the flexible wiring board 10 where the chip 5 is mounted. The resin 6 provides protection to the semiconductor chip 5.

Now, a manufacturing method of the semiconductor device 11 will be described.

Semiconductor devices 11 are fabricated on a polyimide film 40 which has elongated sprocket holes 41 as shown in FIG. 1(b). The devices 11 are arranged to form a row along the length of the polyimide film 40. Areas are prepared first in a row on the polyimide film 40 to accommodate semiconductor chips 5. Then, the semiconductor chips 5 are mounted in the areas. The individual semiconductor chips 5, along with the polyimide film 40, are cut off along the broken lines for use. The FIG. 1(a) semiconductor devices 11 are completed in this manner. In the following description, the term, polyimide base component 1, is inclusive of the part of the polyimide film 40 inside the broken lines and the cut-off polyimide film.

The manufacturing method is now detailed. Referring to FIG. 2, a layer of nickel-chromium alloy is initially formed on the polyimide base component 1 by sputtering. A copper foil is then formed on the surface of this metal layer by metalizing (i.e., copper plating). Next, a photoresist is applied onto the copper foil and cured. Thereafter, the photoresist is exposed and developed to form a pattern which matches a desired wiring pattern. The metal layer and the copper foil are etched in accordance with the photoresist pattern. Removing the photoresist completes the transfer of the desired pattern onto the metal layer and the copper foil. The entire surface of the formed pattern is plated with tin 8 up to 0.4 to 0.6 μm, to complete the fabrication of the wires 9. Further, the solder resist 7 is disposed at a distance from the part of the board 10 where the semiconductor chip 5 will be mounted, so as to cover parts of the wires 9.

The semiconductor chip 5 is joined to the board 10 where the chip 5 is to be mounted. The joints are formed by gold-tin eutectic between the bumps (protruding electrodes) 4 of the semiconductor chip 5 and the tin plating 8 of the wires 9. The gold-tin eutectic joining step through thermocompression is termed inner lead bonding (ILB).

After the ILB, the gap between the semiconductor chip 5 and the flexible wiring board 10 is filled with an underfill (i.e., thermosetting) sealing resin 6 to provide protection to the semiconductor chip 5. The sealing resin 6 is then thermally cured.

Thereafter, a final test as to electrical connections is conducted to complete the fabrication of the semiconductor device 11.

Figure 4:
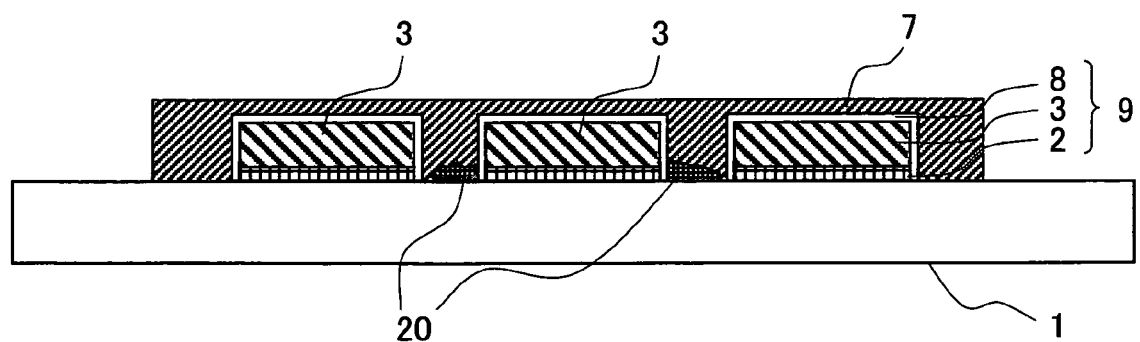
FIG. 4 is a plan view illustrating a semiconductor device in which electromigration occurred.
Figure 5:
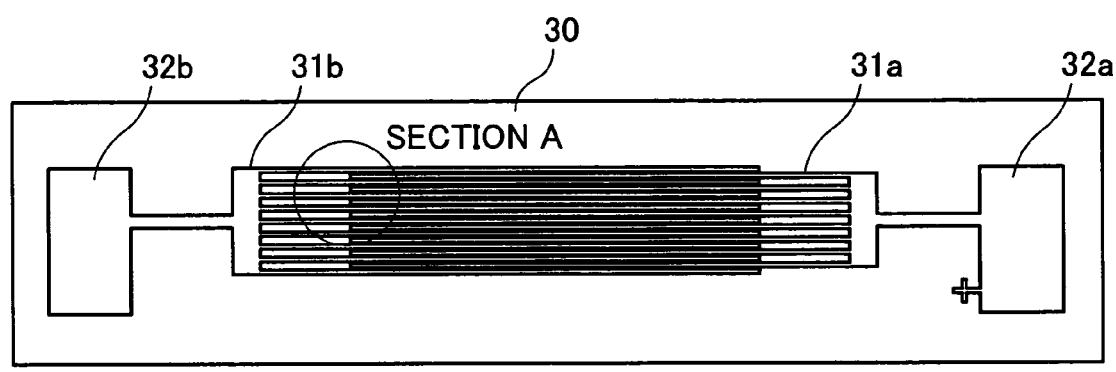
FIGS. 5(a) and 5(b) are plan views illustrating a pectinate wiring board for the measurement of an electromigration limiting effect of a sealing resin.
Figure 5:
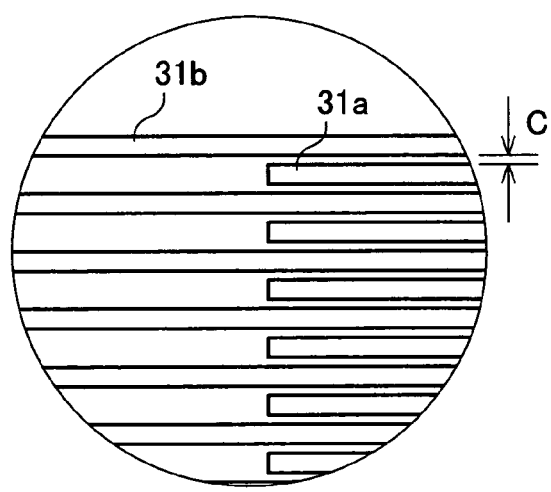

In semiconductor devices fabricated in this manner, the component metals of the wires 9 (i.e., the metal materials for the barrier layer 2, conductor layer 3, tin plating 8) are readily ionized, especially at high temperatures and humidity. The metal ions thus produced are mostly copper ions. As shown in FIG. 4, these metal ions migrate from wires 9 and deposit between the wires (deposit metal 20). This is electromigration and it can lead to an electrical isolation breakdown between adjacent wires 9. The electromigration-caused isolation breakdown is likely when the wires 9 have a 50 μm or smaller pitch, especially when 30 μm or smaller. To prevent the metal ion deposition, there is provided an arrangement which can capture produced copper ions with a metal ion binder before the ions deposit.

The metal ion binder is either added to the material of at least one of members which come in contact with the wires 9, before that member is formed. Alternatively, the binder is applied directly to the wires 9. Such members in contact with the wires 9 include the sealing resin 6, the base film 1, and the solder resist 7.

As shown in FIG. 2, for example, the sealing resin 6 fills the gap between the semiconductor chip 5 and the flexible wiring board 10. Near the tips of the bumps 4 of the semiconductor chip 5 where they connect to the plating 8, the resin 6 reaches as far as the spacings between the wires 9. Therefore, the metal ion binder forming a complex with the metal ions, if added to the sealing resin 6 in advance, captures metal ions migrating from the wires 9 into the sealing resin 6. This adds to the solubility of metal ions in the sealing resin 6. In other words, the sealing resin 6 can hold an additional number of metal ions migrating to it from the wires 9. This in turn limits increases of metal ions in the wires 9 and slows down the rate of deposition of the metal ions from all the wires 9.

Likewise, the solder resist 7 reaches the spacings between the wires 9, because it is disposed to cover the wires 9. See FIGS. 2 and 3. Therefore, the metal ion binder forming a complex with the metal ions, if added to the solder resist 7 in advance, captures metal ions migrating from the wires 9 into the solder resist 7. This adds to the solubility of metal ions in the solder resist 7. In other words, the solder resist 7 can hold an additional number of metal ions migrating to it from the wires 9. This in turn limits increases of metal ions in the wires 9 and slows down the rate of deposition of the metal ions.

In addition, the base film 1 has the wires 9 on its surface and is in contact with the entire surface of the barrier layer 2 in the wires 9. Therefore, the metal ion binder forming a complex with the metal ions, if added to the base film 1 in advance, captures metal ions migrating from the wires 9 onto the base film 1. This adds to the solubility of metal ions in the base film 1. In other words, the base film 1 can hold an additional number of metal ions. This in turn limits increases of metal ions in the wires 9 and slows down the rate of deposition of the metal ions.

Alternatively, the metal ion binder may be applied onto the wires 9 to capture metal ions which are migrating in wires 9. This limits increases of metal ions in the wires 9 and slows down the rate of deposition of the metal ions. There are some concrete methods to apply the metal ion binder to the wires 9. One is to immerse the flexible wiring board 10 in a solution of the metal ion binder immediately after the formation of the wiring pattern in the manufacture of the flexible wiring board 10. Another is to spray the metal ion binder onto the wires 9.

By limiting the deposition of the metal ions migrating from the wires 9 in this manner, the wires 9 can retain their electrical isolation in the semiconductor device even in a high humidity environment. Short-circuiting is limited.

The metal ion binder may be any compound that forms a complex with copper and other various metal ions. Produced copper and other ions are captured by the metal ion binder as they form a complex. The ions are prevented from depositing between the wires 9. Therefore, adjacent wires 9 are prevented from conducting.

Some examples of the metal ion binder are benzotriazoles, triazines, and isocyanuric acid adducts of these compounds.

A typical benzotriazole is the preliminary benzotriazole of chemical formula (1). Others include a methanol adduct, 1H-benzotriazole-1-methanol (chemical formula (2)), the benzotriazole with an alkyl group added to the triazole (chemical formula (3)), and the benzotriazole with an alkyl group added to the benzene ring chemical formula (4)).

[Formula 1]

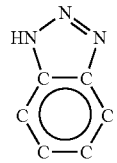

(1)

-continued (2)
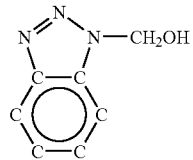

(3)
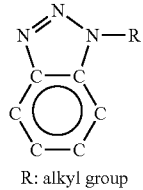
R: alkyl group (4)
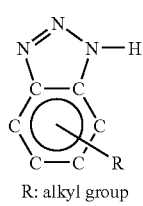
R: alkyl group

The triazines have chemical formula (5). Specific examples include 2,4-diamino-6-vinyl-S-triazine of chemical formula (6), 2,4-diamino-6-[2'-ethyl-4-methylimidazole-(1)]-ethyl-S-triazine of chemical formula (7), and 2,4-diamino-6-methacryloyloxyethyl-S-triazine of chemical formula (8).

[Formula 2]

(5)
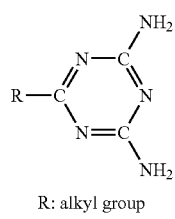
R: alkyl group (6)
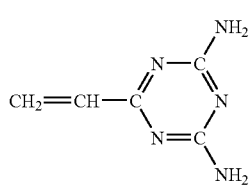

(7)
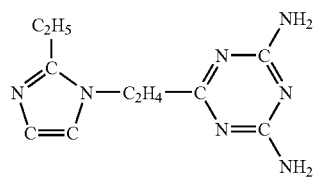

-continued (8)
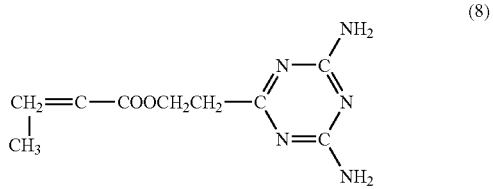

The isocyanuric acid adducts are the above triazine and benzotriazole compounds to which the isocyanuric acid of chemical formula (9) is added. The triazine/isocyanuric acid adducts generally have chemical formula (10). Examples include 2,4-diamino-6-vinyl-S-triazine/isocyanuric acid of chemical formula (11) and 2,4-diamino-6-methacryloyloxy-ethyl-S-triazine of chemical formula (12).

[Formula 3]

(9)
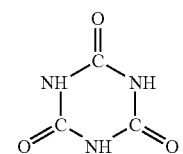

(10)
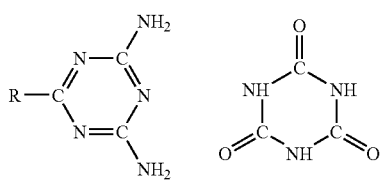

(11)
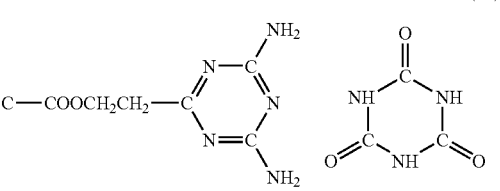

(12)
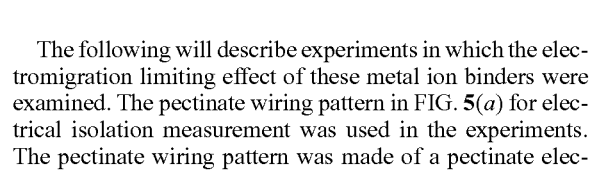

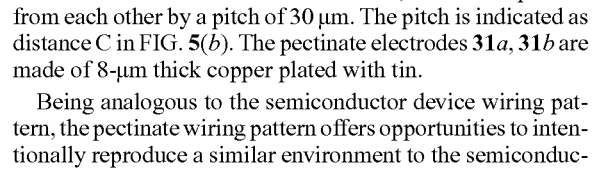

The following will describe experiments in which the electromigration limiting effect of these metal ion binders were examined. The pectinate wiring pattern in FIG. 5(a) for electrical isolation measurement was used in the experiments. The pectinate wiring pattern was made of a pectinate electrode 31a and another pectinate electrode 31b, both provided on a polyimide board 30. The pectinate electrode 31a connects to a cathode, and the pectinate electrode 31b to an anode. The tooth of the electrodes 31a, 31b are separated from each other by a pitch of 30 μm. The pitch is indicated as distance C in FIG. 5(b). The pectinate electrodes 31a, 31b are made of 8-μm thick copper plated with tin.

Figure 6:
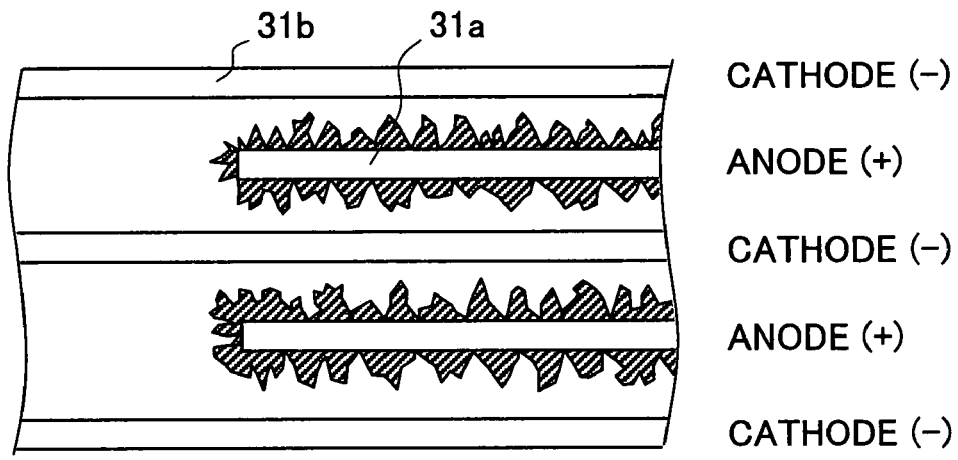
FIG. 6 is a plan view illustrating electromigration around the FIG. 5 pectinate wires.

Being analogous to the semiconductor device wiring pattern, the pectinate wiring pattern offers opportunities to intentionally reproduce a similar environment to the semiconductor device wiring for observation of electromigration. The electromigration can be measured by leak current. Concretely, metal ions migrate from the pectinate electrodes 31a, 31b and deposit between the pectinate electrodes 31a, 31b. This electromigration and deposition results in growth of metal there as shown in FIG. 6, ultimately to the point where the pectinate electrodes 31a, 31b are interconnected. With voltage being applied across the pectinate electrodes 31a, 31b, the leak current dramatically increases when the interconnection occurs. Thus, the interconnection of the pectinate electrodes 31a, 31b is observable through measurements of the leak current.

In the experiments, each metal ion binder listed in Table 1 was added to pure water to a predetermined concentration. The binder dispersed in the water. A predetermined quantity of the mixture was then applied dropwise uniformly across the surface of the pectinate wiring pattern. After the application, a predetermined DC voltage was applied across the pectinate electrodes 31a, 31b, which was then let sit at room conditions. A change of the leak current value was measured at predetermined intervals. Results are shown in Table 1.

TABLE 1

| Metal ion binder | Electromigration limiting effect | Solubility in resin |
|---|---|---|
| Pure water (no additions; comparative ex.) | No effect | — |
| Benzotriazole | Excellent | Soluble |
| 1H-benzotriazole-1-methanol | Excellent | Soluble |
| 2,4-diamino-6-vinyl-S-triazine/isocyanuric acid adduct | Excellent | Insoluble |
| 2,4-diamino-6-methacryloyloxyethyl-S-triazine/isocyanuric acid adduct | Good | — |
| 2,4-diamino-6-[2'-ethyl-4-methylimidazole-(1)]-ethyl-S-triazine | Good | — |
| 2-vinyl-4,6-diamino-S-triazine | Poor | — |

The pure water (comparative example) showed no electromigration limiting effect. A very good electromigration limiting effect was observed with the benzotriazole, the 1H-benzotriazole-1-methanol, and the 2,4-diamino-6-vinyl-S-triazine/isocyanuric acid. A moderate electromigration limiting effect was observed with the 2,4-diamino-6-methacryloyloxyethyl-S-triazine/isocyanuric acid and the 2,4-diamino-6-[2'-ethyl-4-methylimidazole-(1)]-ethyl-S-triazine. A poor, but unmistakable electromigration limiting effect was observed with the 2-vinyl-4,6-diamino-S-triazine.

Next, the metal ion binders which exhibited excellent electromigration limiting effect were examined as to how well they dissolve in resin. A substance is said to "dissolve" when it disperses in another and does not aggregate in mixture with another. The benzotriazole and the 1H-benzotriazole-1-methanol showed good compatibility with resin; they dispersed in resin. In contrast, the 2,4-diamino-6-methacryloyloxyethyl-S-triazine/isocyanuric acid was not so compatible with resin; it hardly dispersed in resin.

Such a poor compatibility metal ion binder does not disperse in the sealing resin when mixed with it. The binder aggregates and does not distribute uniformly. This is especially so with the 2,4-diamino-6-vinyl-S-triazine/isocyanuric acid adduct. The adduct hardly mixes with acid anhydrides and like resins and tends to aggregate. Therefore, if the binder is used with a resin, for example, the sealing resin 6, the resin may locally fail to capture sufficient metal ions.

As such, the metal ion binder which poorly disperses in resin, like the 2,4-diamino-6-vinyl-S-triazine/isocyanuric acid adduct, needs be pulverized before use for uniform dispersion and mixture. The metal ion binder is preferably pulverized to an average diameter of 1 μm or smaller, and more preferably to 0.5 μm or smaller. Filtering through a fine cutout filter with a 1-μm mesh is also effective in the prevention of aggregation of the metal ion binder. The pulverization and mixing for uniform dispersion of the metal ion binder preferably involves kneading of the sealing resin in a roll mill or a bead mill.

Now, let us take the metal ion binder mixed with the sealing resin 6 as an example, to describe the manufacture of sealing resin material mixed with the metal ion binder.

Examples of the resin component for the sealing resin 6 include epoxy resins and acid anhydrides. The metal ion binder in fine particle form, a dye, and a curing accelerator are added to an epoxy resin and kneaded. These components are mixed, for example, so that the epoxy resin and curing agent together account for 99.6 wt. %, the metal ion binder for 2.5 wt. %, the dye and the curing accelerator for 0.9 wt. %.

We examined a suitable metal ion binder content in the sealing resin 6 to achieve effective electromigration limitation and good fluidity.

First, we examined a necessary metal ion binder content for electromigration limitation effect. The experiment was conducted as follows. Sealing resins were prepared by adding the 2,4-diamino-6-vinyl-S-triazine/isocyanuric acid adduct (metal ion binder) to an epoxy resin to a concentration of 0, 0.5, 1.5, 2.5, 5.0, 10.0, 15.0 wt. %. Each sealing resin was applied uniformly across the entire surface of a pectinate wiring pattern in FIG. 5. The completed samples were let sit in an environment of 85° C./85% RH and an application voltage of 40 volts DC. Thereafter, leak current was measured. The metal ion binder was mixed with the epoxy resin in a roll mill or bead mill. The resultant resin/binder mixtures contained the epoxy resin and the metal ion binder as primary components; however, the mixture containing no metal ion binder at all was 99.3 wt. % the epoxy resin and curing agent and 0.7 wt. % the dye and curing accelerator.

Figure 7:
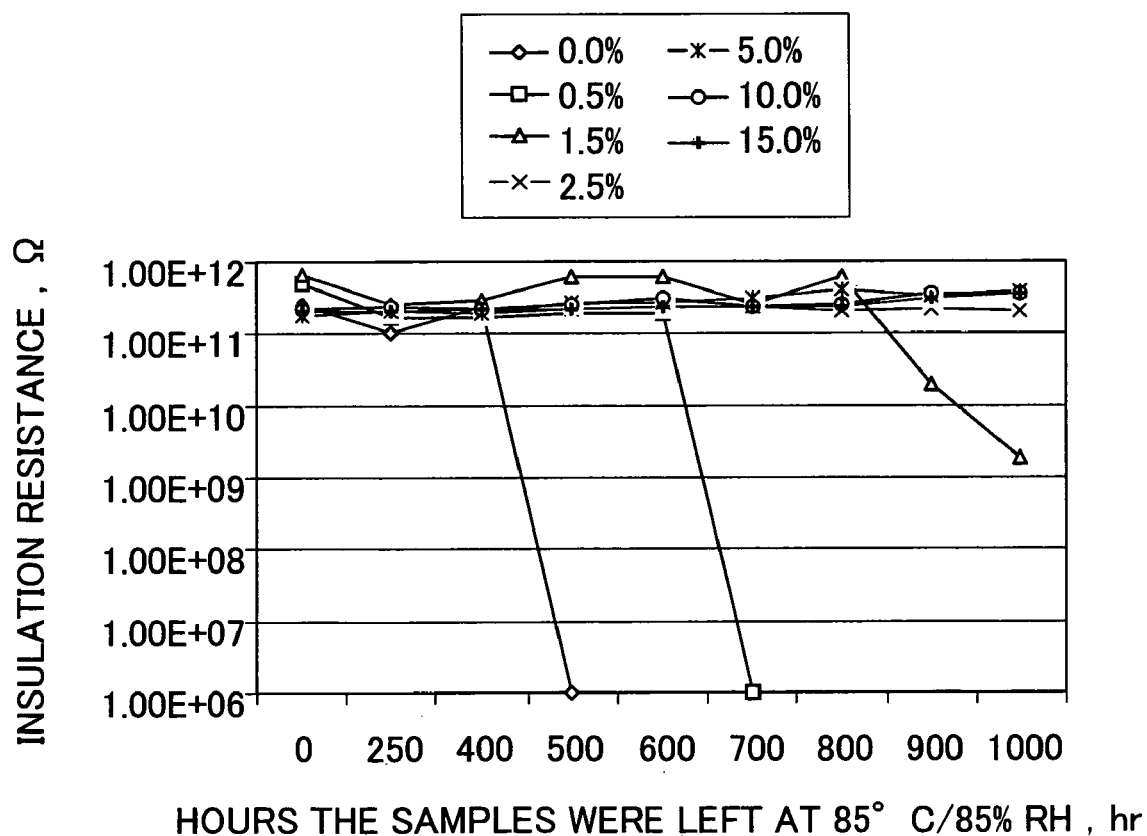
FIG. 7 is a graph demonstrating an electromigration limiting effect of a sealing resin containing a metal ion binder.

Results are shown in FIG. 7. In FIG. 7, the horizontal axis indicates how many hours the samples were left in the aforementioned environment. The vertical axis indicates changes of insulation resistance between the pectinate electrodes 31a, 31b. The resistance values were calculated from leak current measurements. In the resin with no metal ion binder content, electromigration and deposition of the wire copper caused an isolation breakdown at 500 hours. In contrast, in the resin with a 0.5% metal ion binder content, no isolation breakdown occurred up to 700 hours; electromigration of the wires 9 was delayed. The resin with a 1.5% metal ion binder content retained good electrical isolation up to 900 hours, but the electrical isolation deteriorated progressively after that; the lessening of the electrical isolation was further slowed down. No complete isolation breakdown occurred up to 1000 hours (no measurement was made after 1000 hours). The other resins with a 2.5 wt. % or greater metal ion binder content showed stable isolation even at 1000 hours (no measurement was made after 1000 hours). From these results, it may be safely concluded that the greater the metal ion binder content, the better the electrical isolation even at high temperatures and humidity. Therefore, to achieve good electromigration limiting effect through the application of a resin containing a metal ion binder, the metal ion binder preferably accounts for 0.5 wt. % or more of the resin, especially 2.5 wt. % or more.

We also examined a suitable metal ion binder content in the sealing resin 6 to achieve necessary fluidity. The aforementioned metal ion binder forms a complex with metal ions and also, when mixed with a resin, accelerates the curing of the resin because of its molecular structure. If an excessive quantity of the metal ion binder is added to the sealing resin 6, the viscosity of the sealing resin 6 increases too much. The high viscosity in turn makes it difficult to fill with the sealing resin 6. The sealing resin 6 is dispensed from a dispenser to fill the spacing between the semiconductor chip 5 and the flexible wiring board 10. If the viscosity of the sealing resin 6 is high, the dispenser cannot eject the resin 6 in a stable manner. Further, the sealing resin 6 is expected to have such fluidity that it can completely fill the spacing between the semiconductor chip 5 and the flexible wiring board 10. If the viscosity of the sealing resin 6 is too high, the fluidity becomes too low, and it becomes impossible to completely fill the spacing between the semiconductor chip 5 and the flexible wiring board 10 with the sealing resin 6. Therefore, if the metal ion binder is mixed with the sealing resin 6, due attention needs be paid to the increases of the viscosity so that the mixing does not result in poor fluidity. The suitable viscosity of the sealing resin 6 in view of the filling is from 50 mPa·s to 1250 mPa·s inclusive, preferably from 200 mPa·s to 1000 mPa·s inclusive.

To achieve such a value, the sealing resin 6 preferably contain 10 wt. % or less binder, more preferably 5 wt. % or less binder.

Table 2 shows measurements of the viscosity of sealing resins containing the epoxy resin and the 2,4-diamino-6-vinyl-S-triazine/isocyanuric acid adduct (metal ion binder) with the concentration of the latter varying from 0 wt. % to 15 wt. %. The sealing resin contained the epoxy resin and the metal ion binder as primary components.

The sealing resin with no metal ion binder content (0 wt. %) had a viscosity of 850 mPa·s. The viscosity of the

TABLE 2

Figure 8:
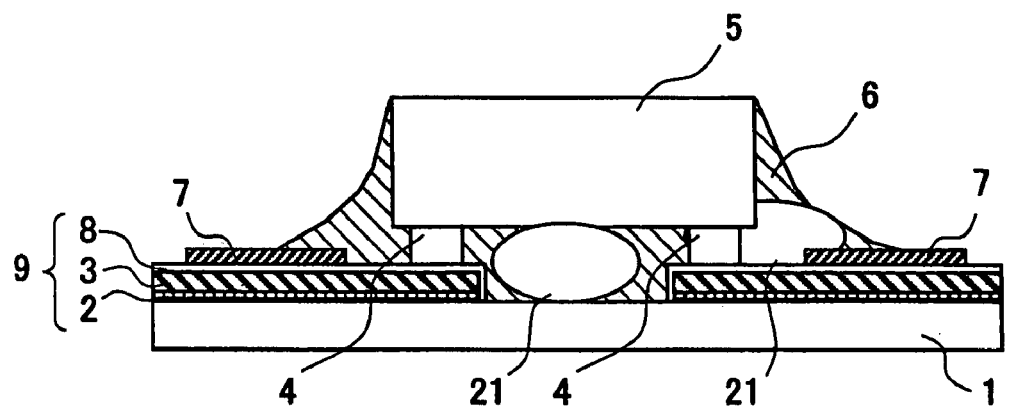
FIG. 8 is a cross-sectional view illustrating a semiconductor device sealed with a sealing resin having high viscosity. Note bubbles trapped inside the resin.
Figure 9:
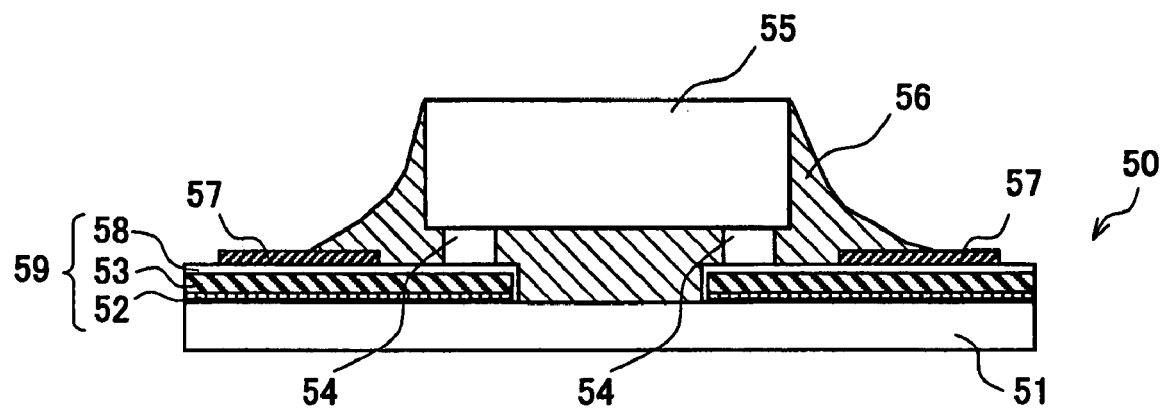
FIG. 9 is a cross-sectional view illustrating a conventional semiconductor device.

| Metal ion binder content (wt. %) | Resin viscosity (mPa·s) | Resin ejection/filling |
|---|---|---|
| 0% | 850 | Excellent |
| 0.50% | 865 | Excellent |
| 1.50% | 900 | Excellent |
| 2.50% | 930 | Excellent |
| 5.00% | 1000 | Excellent |
| 10.00% | 1250 | Good |
| 15.00% | 1500 | Poor | sealing resin increased positively with the quantity of the added metal ion binder. When the metal ion binder content was 5 wt. % or less, the viscosity was lower than 1000 mPa·s. Such sealing resins are ejected well from the dispenser and completely fill the spacing between the semiconductor chip 5 and the flexible wiring board 10, leaving no voids. However, with the metal ion binder content at 10 wt. %, the viscosity was 1250 mPa·s. This sealing resin is ejected a little less well and fills the gap a little less completely. With the metal ion binder content at 15 wt. %, the viscosity was 1500 mPa·s. The sealing resin cannot be smoothly ejected from the dispenser. In addition, if this sealing resin is used to fill the spacing between the semiconductor chip 5 and the flexible wiring board 10, it fills the spacing only partially as shown in FIG. 8, trapping bubbles 21. The bubbles 21, if present between the semiconductor chip 5 and the flexible wiring board 10, the semiconductor chip 5 is not reliably fixed to the flexible wiring board 10, possibly leading to defective interconnects. Also, the bubbles 21 may accumulate moisture, making the semiconductor chip protection less reliable.

Alternatively, the viscosity increases in the sealing resin may be limited by regulating the effect of the curing accelerator added to the sealing resin. For example, the curing accelerator component may be soaked up in a capsule so that the component can limit curing at low temperatures. Alternatively, the curing accelerator may be modified to have such a molecular structure that it can limit curing at low temperatures.

Further, the viscosity of the sealing resin or the added curing accelerator may be adjusted to prevent short resin life and high concentrations of impurity ions.

If the metal ion binder is to be added to the solder resist 7, the metal ion binder is added to 0.5 wt. % or more before the components of the solder resist 7 are cured. The whole mixture is cured thereafter. The solder resist 7 prepared this way is capable of making the wires 9 less susceptible to electromigration. If the solder resist 7 is disposed by printing, the metal ion binder content is preferably 10.0 wt. % or less so that the resist 7 has suitable properties for printing.

If the metal ion binder is to be added to the base film 1, the metal ion binder is added to 0.5 wt. % or more before the components of the base film 1 are cured. The mixture is mixed and then cured, which makes the wires 9 less susceptible to electromigration. If this option is chosen, the metal ion binder content is preferably 10.0 wt. % or less to retain properties of materials.

If the metal ion binder is to be applied to the wires 9, the metal ion binder is preferably dissolved in a solvent, e.g. pure water, at 0.5 wt. % or more. The wires 9 can be made less susceptible to electromigration in this manner too.

As detailed so far, the present invention is capable of limiting occurrences of isolation breakdown between adjacent fine-pitched wires. Therefore, the invention is preferably applicable to semiconductor devices which are facing increasing demand for finer wiring pitches and higher voltages, especially to those containing a flexible board as their base component, those fabricated by tape carrier packaging, and those containing a liquid crystal display element.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

The present invention may be described as follows:

A first aspect of the invention relates to a semiconductor device including a semiconductor element on a flexible film having a wiring pattern formed thereon. The aspect is characterized in that an electromigration limiting agent (metal ion binder) is added/mixed in the sealing resin provided for the protection of the semiconductor chip, in the solder resist, or in the base component or applied onto the surface of the wiring pattern, so as to improve electrical isolation between wires.

A second aspect of the invention relates to the first semiconductor device and is further characterized in that the electromigration limiting agent is a benzotriazole, a triazine, an isocyanuric acid, or a substance having the same composition as a triazine/isocyanuric acid adduct.

A third aspect of the invention relates to the first or second semiconductor device and is further characterized in that the electromigration limiting agent is added/mixed with a material to 0.5 to 10.0 wt. %, so as to prevent high viscosity of the resin and aggregation of the electromigration limiting agent which can happen in the process of adding the electromigration limiting agent.

A fourth aspect of the invention relates to the first semiconductor device and is characterized in that the electromigration limiting agent used as the protective sealing resin is adjusted to a viscosity of 50 to 1250 mPa·s using a curing accelerator with a high viscosity prevention effect, so as to prevent high viscosity of the resin which can happen in the process of adding the electromigration limiting agent.

A fifth aspect of the invention relates to a semiconductor device includes a semiconductor element on a flexible film having a wiring pattern formed thereon. The aspect is further characterized in that: a surface process is done using an electromigration limiting agent on the surface of the wiring pattern on the flexible film (an electromigration limiting agent is soaked up or sprayed); and the flexible film has the electromigration limiting agent applied onto the surface of the wiring pattern, so as to improve electrical isolation between wires.

A sixth aspect of the invention device relates the first to fifth semiconductor devices and is further characterized in that it relates to a tape carrier semiconductor device where: the flexible film is like an elongated tape; and the semiconductor element is continuously mounted to the flexible film.

A seventh aspect of the invention relates to the first to fifth semiconductor devices and is further characterized in that it relates to a semiconductor device for a liquid crystal module carrying a liquid crystal display element and associated components.

The semiconductor device in accordance with the present invention prevents deposition of the wires' metal components and interwire isolation breakdown. The device is thus suitable especially to narrow wire pitches. The device is applicable, for example, to semiconductor devices containing a flexible board as their base component, those fabricated by tape carrier packaging, and those containing a liquid crystal display element.

The semiconductor device in accordance with the present invention, as described in the foregoing, includes: a wiring board including a base component and wires; and a semiconductor element mounted to the wiring board. In the semiconductor device, a metal ion binder is either mixed with the material for a member in contact with the wires or added to the surface of the wires.

The mixture or addition enables metal ions from the wire material to come in contact with the metal ion binder contained in a member in contact with the wires or added to the surface of the wires. The metal ions are thus captured and prevented from depositing. The growth of the wire-originating metal is also prevented. The semiconductor device is prevented from developing operational failures.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
a wiring board including a base component and wires; and
a semiconductor element provided on the wiring board,
wherein
a metal ion binder either is mixed with a material for a member in contact with the wires or added to a surface of the wires,
the metal ion binder captures metal ions from the wires,
the metal ion binder contains at least one compound selected from the group consisting of benzotriazoles, triazines, and isocyanuric acid adducts of these compounds, and
the metal ion binder accounts for from 0.5 wt. % to 10.0 wt. % inclusive of the sealing resin.

2. The semiconductor device as set forth in claim 1, wherein: the wires are provided on a surface of the base component; and the base component contains the metal ion binder.

3. The semiconductor device as set forth in claim 1, further comprising a solder resist disposed to cover the surface of the wires, the solder resist containing the metal ion binder.

4. The semiconductor device as set forth in claim 1, wherein the wiring board is a flexible film.

5. The semiconductor device as set forth in claim 4, wherein the semiconductor element is mounted to the wiring board by tape carrier packaging.

6. The semiconductor device as set forth in claim 1, carrying a liquid crystal display element.

7. The semiconductor device as set forth in claim 1, wherein the metal ion binder forms a complex with metal ions originating from the wires.

8. A semiconductor device comprising:
a wiring board including a base component and wires;
a semiconductor element provided on the wiring board; and
a sealing resin disposed between the wiring board and the semiconductor element so as to be at least partially in contact with the wires, the sealing resin containing a metal ion binder, wherein
the metal ion binder captures metal ions from the wires,
the metal ion binder contains at least one compound selected from the group consisting of benzotriazoles, triazines, and isocyanuric acid adducts of these compounds, and
the metal ion binder accounts for from 0.5 wt. % to 10.0 wt. % inclusive of the sealing resin.

9. The semiconductor device as set forth in claim 8, wherein the sealing resin has a viscosity from 50 mPa·s to 1250 mPa·s inclusive upon filling spacing between the wiring board and the semiconductor element.

* * * * *